United States Patent [19]

IHill

[11] Patent Number: 4,927,697

[45] Date of Patent: May 22, 1990

[54] SURFACE MOUNTING LEADLESS COMPONENTS ON CONDUCTOR PATTERN SUPPORTING SUBSTRATES

[75] Inventor: Peter F. IHill, Hatfield, England

[73] Assignee: British Aerospace Public Limited Company, London, England

[21] Appl. No.: 276,841

[22] Filed: Nov. 28, 1988

[30] Foreign Application Priority Data

Nov. 28, 1988 [GB] United Kingdom ............... 8727926

[51] Int. Cl.⁵ .............................................. G32B 3/02
[52] U.S. Cl. .................... 428/198; 428/209; 428/901; 156/252; 156/257; 206/228; 206/230
[58] Field of Search ............... 156/252, 257; 428/209, 428/198, 901; 206/228, 230

[56] References Cited

U.S. PATENT DOCUMENTS

| | | | |
|---|---|---|---|
| 4,666,545 | 5/1987 | DeGree et al. | 156/257 |
| 4,755,249 | 7/1988 | DeGree et al. | 156/257 |

FOREIGN PATENT DOCUMENTS

| | | |
|---|---|---|
| 0075890 | 4/1983 | European Pat. Off. . |
| 0127682 | 12/1984 | European Pat. Off. . |
| 0131492 | 1/1985 | European Pat. Off. . |
| 0150928 | 8/1985 | European Pat. Off. . |
| 2047973 | 12/1980 | United Kingdom . |
| 2147148 | 5/1985 | United Kingdom . |

Primary Examiner—Patrick Ryan
Attorney, Agent, or Firm—Cushman, Darby & Cushman

[57] ABSTRACT

Flux residue drawn by capillary action into the small gap between a conductor pattern support e.g. a printed circuit board, and a leadless electronic component surface mounted on the support is hard to remove and may corrode the conductor pattern. Herein the component is fixed to the support by a pad of adhesive elastomer so as to give a larger and hence more easily cleanable gap between component and support and the component connector pads are coupled to the conductor pattern by way of solder pillars formed by pre-loading the component connector pads and the pattern with precisely defined amounts of solder and, e.g. during a vapor phase re-flow, causing the pre-loads to merge and form the solder pillars.

5 Claims, 1 Drawing Sheet

SURFACE MOUNTING LEADLESS COMPONENTS ON CONDUCTOR PATTERN SUPPORTING SUBSTRATES

BACKGROUND OF THE INVENTION

1. Field of the Invention

This invention relates to the surface mounting of leadless components on a substrate supporting a conductor pattern, eg. so-called printed circuits.

2. Description of Related Art

It is known to apply solder cream (a mixture of solder particles, flux, solvent and rheological components) to the component connection pads of a printed circuit, place the components, partially cure the cream (warm it in an oven so that it dries) which action adheres the components lightly to the connection pads, and then subsequently to subject the assembly to a solder reflow process (by any of various means, eg. hot gas, vapour phase, infra-red radiation or conductive heating) which melts the solder of the solder cream and fixes the component finally in position.

The main problem with the above technique is that there is left a very small gap, perhaps one to three thousandths of an inch, between the component and the circuit substrate. Flux is drawn into this gap by capilliary action and is then very difficult if not impossible to clean out, ie. so it remains to seep out subsequent to manufacture and perhaps corrode the printed circuit pattern and the joints on components and assemblies. In addition, the thermal contact between the component and the substrate is poor so that stress may occur due to different heating rates of component and substrate during use of the manufactured item, and in any case, the partially cured solder cream is not a strong adhesive and may not be sufficient to maintain the components in place during handling of the circuit prior to the solder reflow process. Finally, especially for circuits which may be subject to very high shock loads and acceleration during use, the fixing of the component to the substrate by virtue only of the component pads being soldered to the conductor pattern may not be sufficient.

SUMMARY OF THE INVENTION

According to one aspect of the invention there is provided a method of mounting a leadless component on a conductor pattern supporting substrate, in which method the component is held in position on the substrate by way of a pad of adhesive material between the component and the substrate and in which the connector pads of the leadless component are then connected by way of solder pillars to the conductor pattern on the substrate, there being a relatively large stand-off between the component and substrate to ease cleansing of the space between the component and substrate around the pad.

According to a second aspect of the invention, there is provided an assembly of a conductor pattern supporting substrate and a leadless component, the component being fixed to the substrate by way of a pad of adhesive between the component and the substrate and by way of solder pillars between the connection pads of the component and the conductor pattern on the substrate.

BRIEF DESCRIPTION OF THE DRAWING

For a better understanding of the invention, reference will be made, by way of example, to the accompanying drawings, in which.

DETAILED DESCRIPTION OF THE PRESENTLY PREFERRED EXEMPLARY EMBODIMENT

Figure 1:
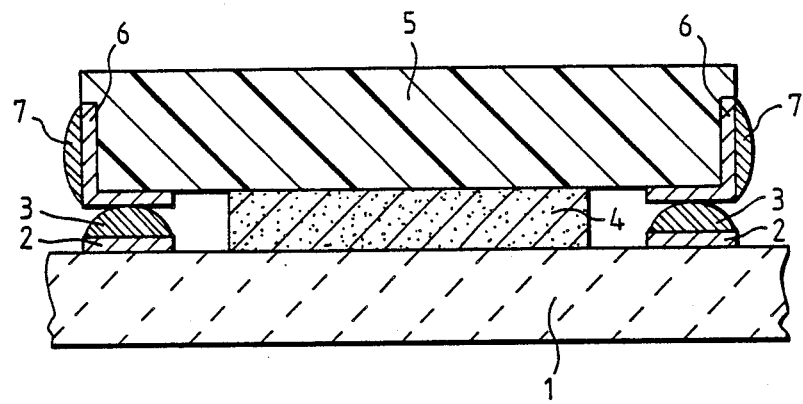
FIG. 1 is a sectional view of a leadless electrical component placed on a printed circuit substrate.

FIG. 1 shows a ceramic substrate 1 carrying a printed circuit pattern including component connection pads 2. Each of the pads 2 has been pre-tinned with solder 3 to a substantially constant known height. A pad of flexible, thermally conductive adhesive 4, for example Redpoint Elastatherm (trade-mark), has then been placed on the substrate 1 and a leadless chip carrier 5 positioned on the adhesive pad so that its connection pads 6 contact the solder 3. The chip-carrier 5 is of the usual kind in which the connection pads 6 are L-shaped and extend down the sides of the carrier and then underneath it. Prior to positioning of the carrier on the substrate, the side portions of the connection pads 6 have each been loaded (tinned) with a predetermined amount of solder 7.

Figure 2:
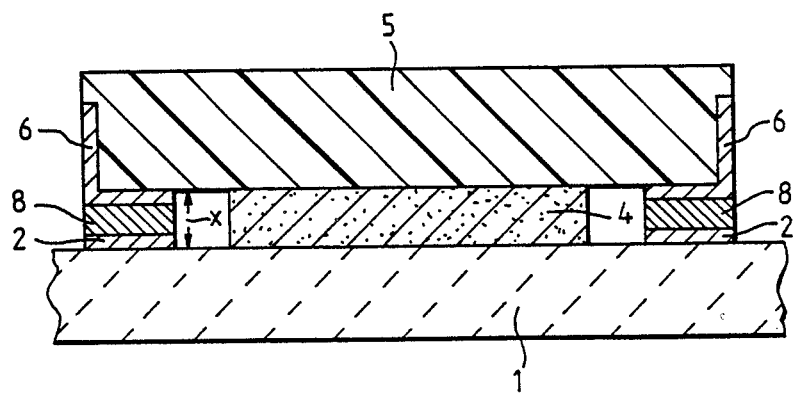
FIG. 2 is the same view after the assembly has been reflow soldered.

The assembly shown in FIG. 1 is then placed in a curing oven to cure the adhesive 4 and firmly affix the chip carrier 5 to the substrate 1. Thereafter, flux, for example liquid Rosin flux is applied to the assembly and it is then reflow soldered. This causes the solder 3 and 7 to melt and the solder 7 to flow down the side portions of the pads 6 and merge with the solder 3 so that the final result is the connection of the underside portions of the pads 6 to the pads 2 by way of respective pillars or bridges of solder 8 as shown in FIG. 2.

For the reflow soldering, a vapor phase process is preferred because it provides an inert, relatively oxygen free environment to the molten solder and also because it is such as to tend to reduce the surface tension of the molten solder, hence improving the ability of solder 7 to flow down and beneath the chip carrier 5.

The provision of the solder tinning on the pads 2 can be done by placing predetermined quantities of solder cream on the pads 2, for example, by screen printing or using an automatic or even a manual dispenser, drying it, and then re-flowing the cream followed by de-fluxing. The chip carrier 5 can be cleaned and dip-tinned which provides a fine surface coating of solder on the connection pads 6 and then, in order to provide the solder loading 7, a pattern of solder cream is screen printed onto a non-wetting surface such as the surface of a bare ceramic substrate (not shown) the pattern being of course matched to that of the pads 6 on carrier 5. The carrier 5 is then positioned on this substrate just as though it were going to be connected thereto by the known manufacturing process, the solder cream dried and then re-flowed. As a result, the solder from the cream becomes loaded onto the pads 6. During the reflow process it may be desireable to apply a gentle downwards force to any relatively light component by placing a small weight on it for example, so as to prevent it from floating upon the molten solder. The components are then de-fluxed.

As one possible alternative to the above method of providing the solder loading 7, solder cream could be applied directly to the connection pads 6 using a syringe for example and the component then reflowed and defluxed.

In the completed assembly shown in FIG. 2, the length x of the gap between the substrate 1 and chip carrier 5, around the adhesive pad 4, is relatively large. By way of example, the gap length x may be between 0.003 and 0.025 inches. Preferably, it is at least 0.005 inches, or preferably greater than or equal to 0.010 inches or better still is about 0.015 inches or more. As a result, any flux which gets into this gap can be easily removed by say a gentle cleaning process which is unlikely to damage any circuit components. Meanwhile satisfactory electrical contact is provided by the solder bridges 8 and the adhesive pad 4 not only improves the thermal contact between the chip carrier 5 and substrate 1 but also ensures that the chip carrier remains in place during handling of the assembly prior to formation of the solder pillars and also provides extra fixing of the chip carrier to the substrate during use of the manufactured assembly. At the same time, because the adhesive of pad 4 remains relatively flexible it permits take up of any differential changes in dimension of the chip carrier and substrate due say to different rates of expansion with temperature.

A protective coating, ie. a so-called conformal coating, may be applied to the completed circuit and this coating, because of the relatively large stand-off between the chip-carrier and substrate, can be made to penetrate all round each individual pillar joint 8 thus giving improved environmental protection for the circuit.

As well as chip carriers, other leadless components for example chip capacitors and resistors and tantalum capacitors can be mounted by the illustrated method. In the case of some components, particularly tantalum capacitors, it may be found better to tin and solder-load the component terminators in one operation, for example by immersing the component in a solder wave to provide a good coating of solder and then immediately lightly impacting the component downwards onto a hot-plate so that some of the still molten solder is driven down near the bottoms of the terminations, and the undersides of the terminations are flattened at the same time.

I claim:

1. An assembly of a conductor pattern supporting substrate and a leadless component comprising:
   a pad of adhesive material fixing the component to the substrate;
   solder pillars between connection pads of the component and the conductor pattern on the substrate further fixing the component to said substrate such that a stand-off distance formed between the component and the substrate.

2. The apparatus claimed in claim 1 wherein said distance is in the range from 0.003 inches to 0.025 inches.

3. A method of mounting a leadless component on a conductor pattern supporting substrate, said method comprising the steps of:
   holding said component in position on the substrate by way of a pad of adhesive material between the component and the substrate;
   connecting connector pads of the leadless component by way of solder pillars to the conductor pattern on the substrate; and
   maintaining a stand-off distance between the component and the substrate so as to alleviate difficulties experienced when cleaning excess material from a space formed between the component and the substrate.

4. A method as in claim 3, wherein said maintaining step includes maintaining said distance in a range from 0.003 inches to 0.025 inches.

5. A method as in claim 3, wherein said connecting step includes curing the adhesive and then reflow soldering the component to the substrate.

* * * * *